(12) United States Patent
Yamamoto et al.

(10) Patent No.: US 6,359,255 B1
(45) Date of Patent: Mar. 19, 2002

(54) METHOD FOR FORMING A THROUGH HOLE IN A CERAMIC GREEN SHEET

(75) Inventors: Takahiro Yamamoto; Tadashi Morimoto, both of Kyoto-fu (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/667,044

(22) Filed: Sep. 21, 2000

Related U.S. Application Data (62) Division of application No. 09/033,026, filed on Mar. 2, 1998, now Pat. No. 9,676,044.

(30) Foreign Application Priority Data

Feb. 28, 1997 (JP) .............................................. 9-045838

(51) Int. Cl.$^7$ ............................................. B23K 26/38
(52) U.S. Cl. ............................ 219/121.71; 219/121.73; 219/121.82
(58) Field of Search ........................ 219/121.7, 121.71, 219/121.73, 121.74, 121.75, 121.82

(56) References Cited

U.S. PATENT DOCUMENTS

| | | | |
|---|---|---|---|
| 3,549,733 A | 12/1970 | Caddell | 219/121.78 |
| 3,742,182 A | 6/1973 | Saunders | 219/121.71 |
| 4,262,186 A | 4/1981 | Provancher | 219/121.7 X |
| 5,108,785 A | * 4/1992 | Lincoln et al. | |
| 5,292,686 A | 3/1994 | Riley et al. | 219/121.71 X |
| 5,378,869 A | 1/1995 | Marrs et al. | 219/121.71 |
| 5,571,429 A | 11/1996 | Smith et al. | 219/121.73 |
| 5,585,019 A | 12/1996 | Gu et al. | 219/121.73 |
| 5,683,600 A | * 11/1997 | Kelley et al. | 219/121.71 |
| 5,759,331 A | 6/1998 | Wallace | 264/400 X |

FOREIGN PATENT DOCUMENTS

| | | |
|---|---|---|
| EP | 0164564 | 5/1985 |
| GB | 2275576 | 8/1994 |
| JP | 61-63405 | 4/1986 |
| JP | 7-193374 | 7/1995 |

OTHER PUBLICATIONS

German Office Action issued Nov. 24, 1999 in a related application.
English translation of Nov. 24, 1999 German Office Action.
Patent Abstracts of Japan, M–1594, Apr. 19, 1994, vol 18, No. 127 (JP 06–15 472 A).
Patent Abstracts of Japan, E–1070, May 22, 1991, vol. 15, No. 200 (JP 03–54 884 A).

* cited by examiner

Primary Examiner—Geoffrey S. Evans
(74) Attorney, Agent, or Firm—Ostrolenk, Faber, Gerb & Soffen, LLP (57) ABSTRACT

A mask is mounted on one surface of a ceramic green sheet which is supported on an X-Y table. The mask is provided with a plurality of through hole transmissive portions. A pulsed laser beam is applied to the mask. The size of the laser beam is sufficiently large to encompass at least several of said through hole transmissive portions. The laser beam passes through the through hole transmissive portions and simultaneously forms a plurality of through holes in the ceramic green sheet. Because the mask is located on (or at least substantially adjacent) the surface of the ceramic green sheet, the size and shape of the through holes will be approximately identical to the size and shape of the through hole transmissive portions, thereby precisely controlling the size and shape of the through holes. The mask can be irradiated while the ceramic green sheet is moving.

17 Claims, 6 Drawing Sheets

METHOD FOR FORMING A THROUGH HOLE IN A CERAMIC GREEN SHEET

This is a divisional of application Ser. No. 09/033,026, filed Mar. 2, 1998 now U.S. Pat. No. 09/676,044.

BACKGROUND OF THE INVENTION

1. Field of the Invention

The present invention relates to a method and apparatus for forming through holes in a ceramic green sheet using a laser.

2. Description of the Related Art

Laminated electronic components are often manufactured by laminating a plurality of ceramic green sheets together. In order to permit electrical connection between the layers, through holes must be formed in the individual layers. Such through holes are conventionally formed by a punching process using a die and a pin. According to the conventional punching process, the dimensional precision of the die and the pin determines the precision of the through hole. However, this conventional process has several drawbacks.

When a through hole having a diameter of 100 micrometers or less must be formed, it is extremely difficult to achieve the desired precision. Also, since the die and the pin have a relatively short life and need to be periodically exchanged. Because the pin and die are expensive, this substantially increases the cost of using the conventional process. Another drawback of the conventional process is that different dies must be used for different types of electronic components. Since the exchange operation is complicated, this adds yet further to the cost of the conventional process.

As a result of these drawbacks, several methods for forming through holes with a laser beam have been proposed. Two such prior art methods, each of which enables accurate formation of through holes having a diameter of approximately 80 micrometers, use laser beams to form through holes in the ceramic green sheet. In accordance with these methods, a single shot of the laser forms a single through hole in the ceramic green sheet. To form a plurality of such through holes, both methods rely on relative movement between the laser beam and the ceramic green sheet. The relative movement ensures that the laser beam moves from point to point along the ceramic green sheet to cut the desired through holes. In the first of these methods, the ceramic green sheet is kept stationary while the laser beam is moved from point to point using a galvanomirror. In the second of these methods, the laser beam is kept stationary and the ceramic green sheet is moved. In both cases, each respective though hole is formed with a separate shot of the laser reducing the productivity of the method.

In both of these prior art methods, the diameter of the laser beam is equal to the desired diameter (approximately 80 micrometers) of the through holes making it possible to apply the laser beam directly to the ceramic green sheet without using a mask. However, this also creates potential problems because the shape of the through hole will be distorted if the laser beam is emitted obliquely.

Figure 8:
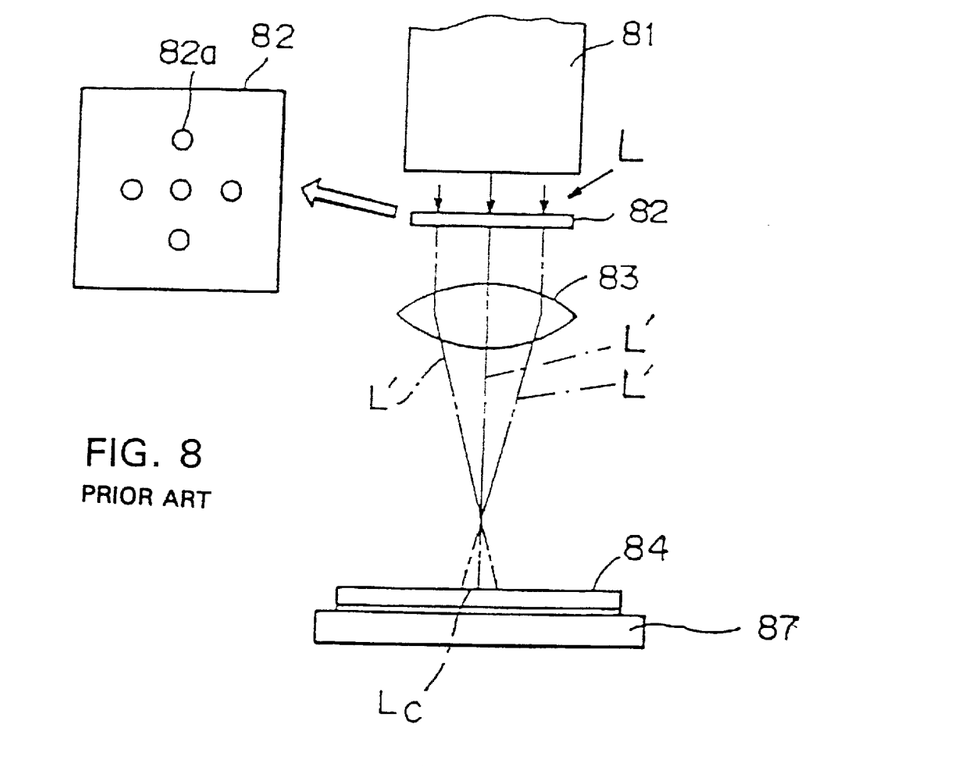
FIG. 8 is a schematic sectional view showing a conventional laser processing apparatus.

To avoid these problems, a laser-beam punching method as shown in FIG. 8 has been proposed. According to this known laser-beam punching method, a mask 82 having a predetermined number of circular through hole transmissive portions 82a is disposed a significant distance from a ceramic green sheet 84 mounted on a table 87. A laser source 81 is used to emit a laser beam L, having a diameter larger than each through hole transmissive portion 82a, through a mask 82. As a result, the single laser beam L' is divided into a plurality of sub beams L' forming a predetermined pattern of light on the ceramic green sheet 84 by means of a converging lens 83. As a result of this structure, a plurality of generally circular through holes are simultaneously formed in an irradiated area Lc on the ceramic green sheet 84.

Figure 9:
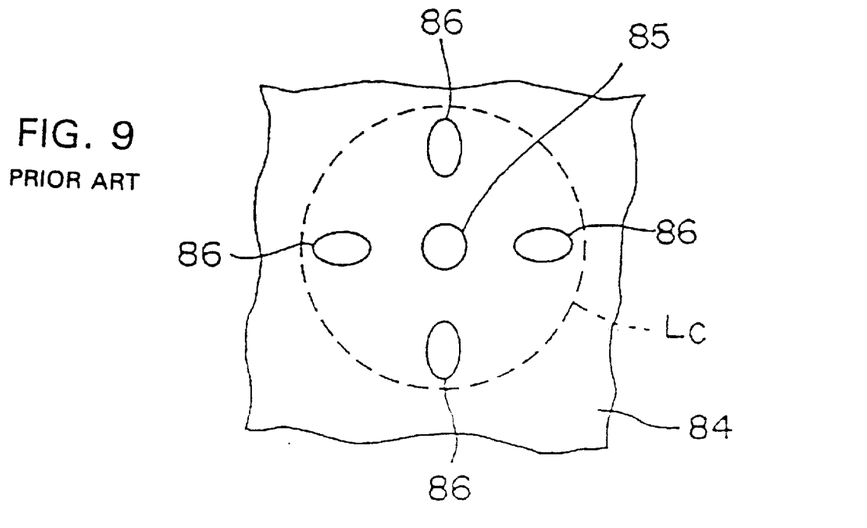
FIG. 9 is a plan view showing through holes formed by a conventional laser processing apparatus.

While overcoming the problems of the above described laser punching methods, this method has its own drawbacks. Because the mask 82 is located a relatively large distance from the ceramic green sheet 84, there will be distortions in the shape of the through holes 86 formed along the perimeter of the irradiation area Lc. See FIG. 9. Only the though hole 85 (defined by the sub beam L' passing through the center opening of the mask 82) formed in the center of the irradiation area Lc will be circular in shape. The peripheral through holes (formed by the sub beams L' passing through the peripheral openings 82a in mask 82) will be elliptical in shape having inferior roundness and a large error from the desired shape. Accordingly, in order to form through holes which are of a desired roundness, it has been necessary to either form each through hole with a separate shot of the laser beam (the diameter of the beam being equal to the diameter of the through hole) or to use an expensive lens which will optically avoid such distortions. The former solution increases processing cost. The latter solution increases the cost of the processing equipment.

SUMMARY OF THE INVENTION

It is an object of the present invention to provide a method and apparatus for forming a plurality of through holes having a desired shape in a ceramic green sheet, with high precision.

According to one aspect of the present invention, a through hole forming method comprises the steps of:

mounting a mask on a surface of a ceramic green sheet, said mask having a plurality of through hole transmissive portions; and irradiating said mask with a laser beam so that through holes are formed in said ceramic green sheet by sections of said laser beam which pass through said through hole transmissive portions.

Preferably, the laser beam is applied while the ceramic green sheet is in motion. In one embodiment, the ceramic green sheet is continuously moved in a predetermined direction, and a laser beam is applied to the ceramic green sheet while the sheet is in motion.

According to another aspect of the present invention, the process comprises the steps of: mounting on a ceramic green sheet supported by a table a mask provided with predetermined through hole transmissive portions; and applying a pulsed laser beam emitted from a laser source to the mask by using a galvanomirror to reflect the pulsed laser beam so that through holes are punched in the ceramic green sheet by laser beams having passed through the through hole transmissive portions, in which the ceramic-green-sheet processing method repetitively applies the pulsed laser beam while changing the reflection angle of the galvanomirror to a predetermined direction.

In each ceramic-green-sheet processing method, the laser beam may be applied to the mask further provided with transmissive alignment marks so that through holes are punched in the ceramic green sheet, and positioning holes may be simultaneously punched by Laser beams having passed through the transmissive alignment marks.

According to a further aspect of the present invention, the foregoing object has been achieved through provision of a laser processing apparatus comprising: a laser source; a laser-source driving circuit for driving the laser source; a table for holding an object to be processed, the object having a mask disposed thereon; a table driving circuit for moving the table in a predetermined direction; a control circuit for sending control signals to the laser-source driving circuit and the table driving circuit; and a converging lens disposed between the laser source and the mask, provided for converging a laser beam emitted from the laser source.

According to a still further aspect of the present invention, the foregoing object has been achieved through provision of a laser processing apparatus comprising: a laser source; a laser-source driving circuit for driving the laser source; a table for holding an object to be processed, the object having a mask disposed thereon; a galvanomirror directed to the table; a galvanomirror driving circuit for changing the reflection angle of the galvanomirror; a control circuit for sending control signals to the laser-source driving circuit and the galvanomirror driving circuit; and a converging lens disposed between the laser source and the mask, provided for converging a laser beam emitted from the laser source.

As is apparent from the foregoing description, according to the present invention, a mask provided with predetermined through hole transmissive portions is mounted on a ceramic green sheet. Thus, through holes having a shape substantially identical to that of the through hole transmissive portions are formed in the ceramic green sheet, and laser beams, having passed through the through hole transmissive portions in the periphery of the mask, simultaneously form a plurality of through holes having a desired shape, with high precision. In addition, it is possible to accurately form a plurality of openings simultaneously without the need for an expensive optical system. Rather the precision with which the mask is formed determines the precision of the through holes formed in the ceramic green sheet. This also makes it possible to use a relatively low precision positioning table, which reduces the cost equipment.

According to the present invention, by applying a laser beam to a ceramic green sheet as the sheet is moved, through holes can be successively punched in the ceramic green sheet, which provides a more suitable manufacturing method. In addition, using a pulsed laser can suppress an increase in the temperature of the ceramic green sheet as it is processed.

According to the present invention, by using a galvanomirror to reflect a laser beam emitted from a laser source to a mask, the laser beam can scan a broad portion of the ceramic green sheet without the need to move the ceramic green sheet. As a result, the overall movement of the ceramic green sheet is minimized, which enables an improvement in processing efficiency.

According to the present invention, by forming both through holes and positioning holes in the same process, their relative positional precision is be increased, which increases the precision with which conductor patterns can be formed in subsequent processes. Also, the need for forming positioning-holes is eliminated, which can shorten production time.

According to the present invention, by using a mask material having high reflectance to a laser beam, a CO2 laser, and a ceramic green sheet with a carrier film having one surface covered with a resin carrier film, the unnecessary portion of the laser beam (those portions of the beam which do not correspond to the through hole transmissive portions) emitted onto the mask is completely shielded by the mask, and the portions of the laser beams which passes through hole transmissive portions and transmissive alignment portions, are efficiently absorbed, so that through holes and positioning hole openings having a desired shape can be formed with higher precision.

BRIEF DESCRIPTION OF THE DRAWINGS

For the purpose of illustrating the invention, there is shown in the drawing several embodiments which are presently preferred, it being understood, however, that the invention is not limited to the precise arrangement and instrumentalities shown.

DESCRIPTION OF THE PREFERRED EMBODIMENTS

First Embodiment

Figure 1:
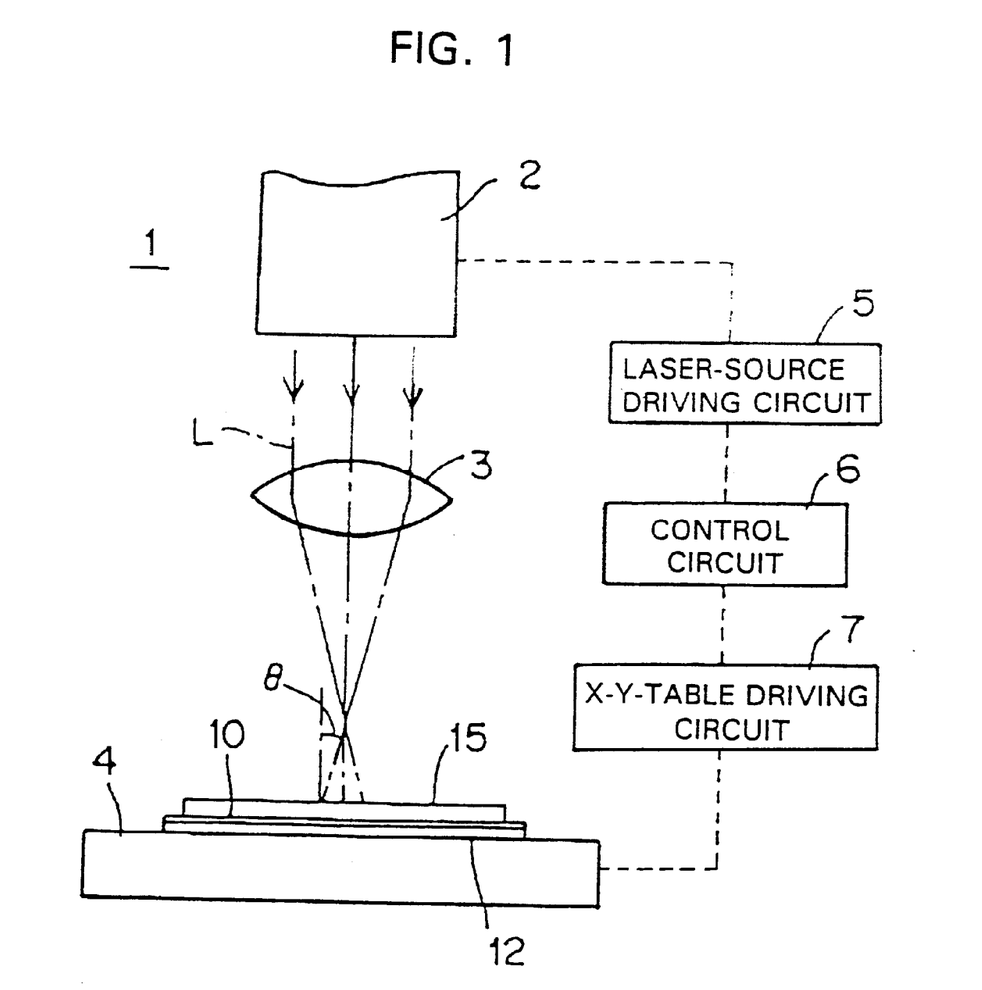
FIG. 1 is a block diagram showing a laser processing apparatus according to a first embodiment of the present invention.

Referring now to the drawings wherein like numerals indicate like elements, there is shown in FIG. 1 a laser-beam punching apparatus 1 constructed in accordance with the principles of the present invention and designated generally as 1. Laser-beam punching apparatus 1 includes a laser source 2, a converging lens 3, an X-Y table 4, a laser source driving circuit 5, a control circuit 6, and an X-Y-table driving circuit 7.

In the preferred embodiment, the laser source 2 is a pulsed oscillating CO2 laser. A driving signal from the laser source driving circuit 5 causes the laser source 2 to emit a laser beam L having a circular shape. Preferably, the laser beam L emitted from the laser source 2 is adjusted so that the energy density within an irradiation portion is approximately uniform and the pulse duration of the laser beam L is of the order of microseconds or milliseconds. The laser beam output power is preferably of the order of $10^2$ to $10^7$ watts, and is arbitrarily set depending on the thickness and the material of a ceramic green sheet 10 to be processed. For example, the laser beam output power can be set at 0.4 kilowatts for a pulse duration of 100 microseconds, or at 5 kilowatts for a pulse duration of 40 microseconds. Because a pulsed laser beam is used, an increase in the temperature of the ceramic green sheet 10 during the punching operation is suppressed.

The ceramic green sheet 10 to be processed is mounted on the top surface of the X-Y table 4. The ceramic green sheet 10 is preferably formed by applying a slurry of a ceramic powder, a binder, etc. To the top surface of a resin carrier film 12 and then blading the film to a desired thickness. Because the ceramic green sheet 10 needs to efficiently absorb the energy of the laser beam L, the binder is preferably formed from a material which exhibits a high absorption of the wavelength of the laser beam L.

In order to enable a plurality of through holes to be formed during each shot of the laser beam, a mask 15 is disposed on the top surface of the ceramic green sheet 10. However, because the mask is disposed directly on (or substantially adjacent to) the top surface of the green ceramic sheet, the distortions noted with respect to the prior art of FIG. 8 will not occur.

Figure 2:
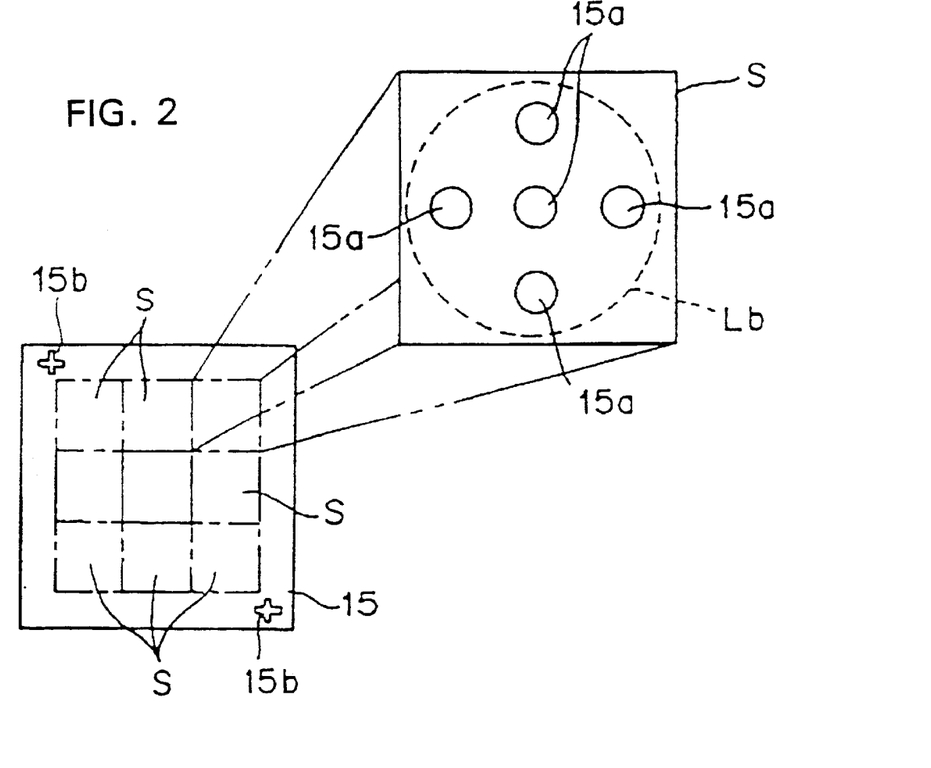
FIG. 2 is a plan view showing a mask shown in FIG. 1.

As shown in FIG. 2, the mask 15 has a matrix of laser-beam irradiation regions S, one for each laser shot. Preferably the mask covers the entire portion of the ceramic green sheet to be processed. In the embodiment shown in FIG. 3, the mask 15 has a matrix of 9 laser beam irradiation region S, each of which is provided with a plurality of (in this embodiment, five) preferably circular through hole transmissive portions 15a having a diameter equal to the desired diameter of the through holes to be formed in the ceramic green sheet 10.

Preferably, the mask 15 also has alignment mark transmissive portions 15b in two or more of its corners. The alignment marks transmissive portions 15b (which are cross shaped in the illustrated embodiment) are used to form positioning holes in the green sheet which will subsequently be used during the steps of forming the conductive patterns onto the green sheets and laminating a plurality of green sheets together.

The transmissive portions 15a and 15b can be transparent members, translucent members, or holes which allow the laser beam L to pass through them. They are preferably formed in the mask 15 by etching, discharge processing, or fine drilling. Since the precision of the holes formed in the green sheet is highly dependant on the precision of the mask 15, it is preferable to form the mask with a high degree of precision, preferably within 20 micrometers. The material for the mask 15 is selected from ones which have high reflectance to the laser beam L in the wavelength band of the laser source 2 and which are resistant to damage caused by the laser beam L. For example, when the laser source 2 comprises a $CO_2$ laser, copper, beryllium copper, brass, stainless steel, or a molybdenum alloy may be used as the material for the mask 15. Depending on circumstances, silver, gold or aluminum may be used. When stainless steel is used, it is preferably magnetic so as to be easily fixed on a table.

In the laser-beam punching apparatus 1, the laser beam L emitted from the laser source 2 is converged by the converging lens 3 to irradiate the mask 15 with a beam spot Lb (shown in FIG. 2) having an irradiation portion approximately equal to a single laser beam irradiation region S. The relative position of the laser beam and mask are periodically changed to move the beam spot Lb from one irradiation region S to the other until all of required through holes have been formed. In the embodiment of FIG. 1, this is done by moving the green sheet 10, and with it the mask 15, using the X-Y table 4. More particularly, the X-Y table 4 moves the ceramic green sheet 10 in the X and Y directions in accordance with a driving signal from the X-Y table driving circuit 7 which in turn is controlled by the control circuit 6. The control circuit 6 includes a microcomputer in which a processing control program is stored.

A single shot of the laser beam will produce a beam having a diameter approximately equal to the size of the irradiation portion S. The laser beam will pass through the transmissive portions 15a, thereby forming the desired through holes. The remainder of the green sheet 10 is protected by the solid portions of the of the mask 15.

The portion of the laser beam L having passed through the through hole transmissive portions 15a and the alignment mark transmissive portions 15b impinges on the ceramic green sheet 10. The energy of these beams is efficiently absorbed by the ceramic green sheet 10 causing the so irradiated portions of the ceramic green sheet 10 to melt and vaporize thereby forming the desired through holes and positioning holes at the same time. Accordingly, the relative positional precision between the through holes and positioning holes increases to improve the precision of the conductor pattern formation process and the lamination processes subsequently applied to the green sheet. Also, the need forming the positioning holes in a different process is eliminated, shortening the production time.

A method for processing the ceramic green sheet 10 with the laser-beam punching apparatus 1 is as follows:

The ceramic green sheet 10 with a carrier film 12 is mounted on the X-Y table 4 using a vacuum chuck so that the top surface of the ceramic green sheet 10 faces upwardly. The mask 15 is mounted on the ceramic green sheet 10 using the vacuum chuck with the X and Y axes of the X-Y table 4 and the two sides of the mask 15 being disposed substantially parallel to one another.

Subsequently, the X-Y table 4 is moved to an initial setting wherein a predetermined part of the mask is positioned under the optical axis of the laser beam L. This is done by detecting two sides of the mask 15 and moving the X-Y table 4 to the desired location relative to those two sides.

After the X-Y table has moved the mask 15, and with it the green sheet 10, to the starting position, the control circuit 6 sends a control signal to the X-Y-table driving circuit 7 and a driving signal from the X-Y-table driving circuit 6 drives the X-Y table 4 to move the mask in a desired pattern. For example, the X-Y table 4 can move the mask in the X-direction at predetermined velocity.

When the mask 15 reaches a first hole-formation position, the control circuit 6 sends a control signal to the laser driving circuit 5, and a driving signal from the laser driving circuit 5 drives the laser source 2 to emit a single shot of the pulsed laser beam L to irradiate a single irradiation portion S. At this time, it is preferable to set an incident angle β (shown in FIG. I) of the laser beam L with respect to the mask 15 to a maximum of 20 degrees. When the incident angle β is in this range, the precision of the shape and position of the formed through hole is substantially identical to the one that is formed when the laser beam L is perpendicular to the mask (i.e., the incident angle β is equal to zero degrees).

Figure 3:
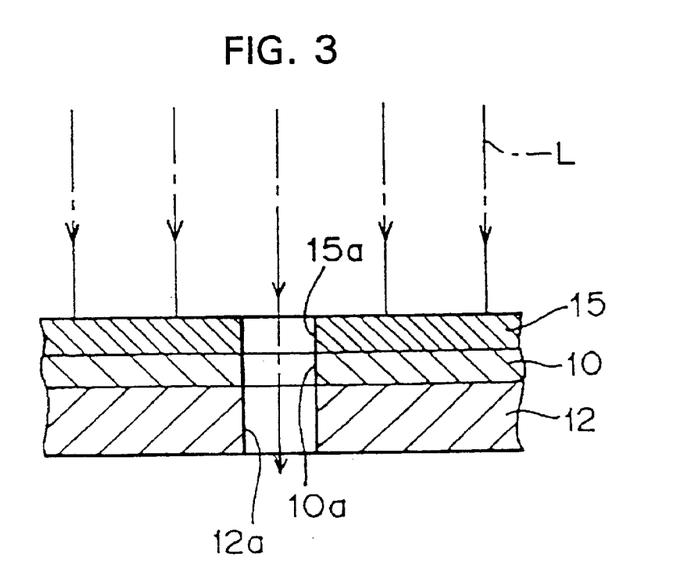
FIG. 3 is a sectional view showing the formation of a through hole by using a laser beam.

FIG. 3 shows a portion of the mask 15, the green sheet 10 and the carrier film 12 being exposed by the laser beam L. The laser beam L passes through one through hole transmissive portion 15a and punches a through hole 10a in the ceramic green sheet 10. Since the mask 15 and the ceramic green sheet 10 are in contact, a through hole 10a having the same shape as the through hole transmissive portion 15a is formed in the ceramic green sheet 10. This is true for both the through hole 10a punched in the center of an irradiation region S and for the through holes formed along the periphery of the irradiation region S. Because the mask 15 is located on (or substantially adjacent to) the green sheet 10, the shape of the through holes formed along the periphery of a given irradiation region S will be almost equally precise as the through holes formed in the center of the irradiation region S. In this manner, a plurality of through holes 10a (and with them through holes 12a) having a desired, preferably round, shape are formed simultaneously. In a similar manner, positioning holes having the desired configuration will also be formed in the green sheet.

After a first set of through holes has been formed from the single laser shot, the X-Y table moves the green sheet 10 to cause another irradiation region S to be exposed to a second shot of the laser beam so as to form a second set of through holes. Subsequently, by intermittently emitting one shot of the Laser beam L for each Irradiation region S, a predetermined number of through holes 10a are punched in the ceramic green sheet 10. This process is repeated until all of the irradiation regions S have been irradiated and all of the through holes have been formed.

In a similar manner, high-precision positioning holes (having the same shape and size as the alignment mark transmissive portions 15b) are formed in the ceramic green sheet 10 as a result of the laser beams L having passed through the transmissive alignment marks 15b. This is preferably done either before or after the through holes 10a are formed.

Since the pulse duration of the laser beam L is of the order of microseconds or milliseconds, the formation of a plurality of through holes 10a by a single shot of the laser beam L is completed substantially instantaneously. For this reason, it is not always necessary to stop the X-Y table 4 each time the laser beam is shot (pulsed). Rather, it is possible to successively form through holes 10a while continuously moving the ceramic green sheet 10. That is, the through holes can be formed on the fly while the green sheet 10 is moving relative to the laser 2.

After a predetermined number of through holes 10a have been formed in the ceramic green sheet 10, the processing is terminated by stopping the X-Y table 4, and using a vacuum chuck or the like to remove the mask 15 from the ceramic green sheet 10.

In accordance with this process, the mask 15 and the ceramic green sheet 10 are in contact. Thus, through holes 10a having substantially the same shape as the through hole transmissive portions 15a, and positioning holes having substantially the same shape as the transmissive alignment marks 15b can be punched in the ceramic green sheet 10. More particularly, this process makes it possible to form substantially round through holes in both the center and periphery of the each irradiation region S of the mask 15.

The following Table 1 compares the results of forming through holes using the conventional process described above and the process according to the first embodiment of the present invention. In Table 1, the processing precision means the positional precision obtained when a through hole having a diameter of 100 micrometers is formed.

TABLE 1

|  | 1st EMBODIMENT | CONVENTIONAL LASER PUNCHING |
| --- | --- | --- |
| PROCESSING PRECISION | +20 μm | +40 μm |

As shown in Table 1, the processing precision according to the first embodiment of the present invention is within "20 micrometers of the processing precision of the mask 15. This value is superior to that of the conventional laser punching processes described above.

Among the advantages of the first embodiment of the present invention is that it is not necessary to use an expensive optical system to accurately form a plurality of holes in the ceramic green sheet 10. Additionally, because the precision with which the holes are formed in the ceramic green sheet 10 is determined by the precision with which the transmissive portions 15a of the mask 15 are formed and not the relative positions of the ceramic green sheet and the laser, a relatively low precision positioning table can be used which reduces the cost of the processing equipment.

After through holes are formed in the ceramic green sheet 10, in a conductor-pattern formation process, conductive paste is printed on the top surface of the ceramic green sheet 10 in a predetermined pattern. At this time, the through holes are also filled with the conductive paste to form internal conductors. The carrier film 12 is removed in a subsequent process for lamination of the ceramic green sheet 10.

Second Embodiment

Figure 4:
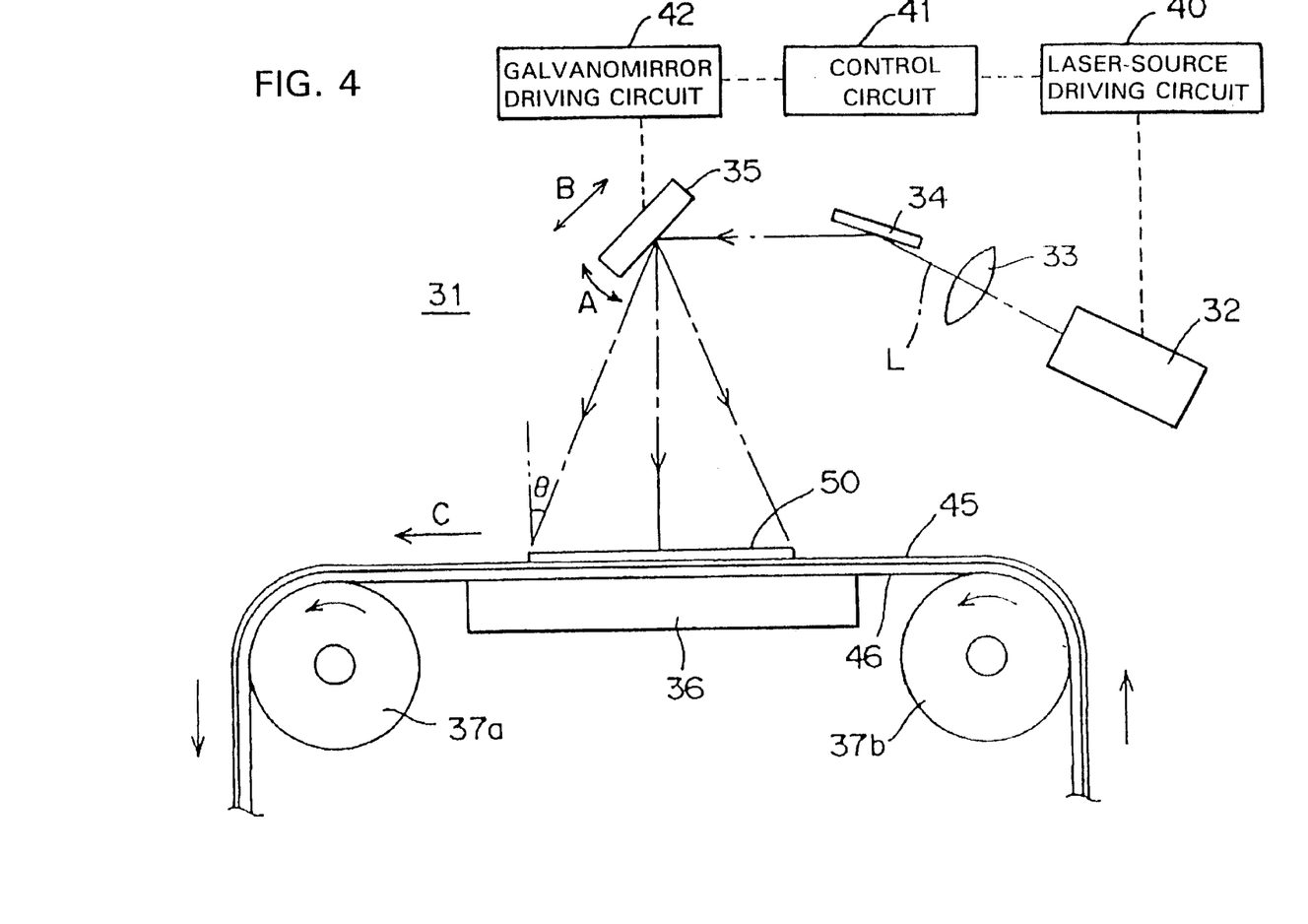
FIG. 4 is a block diagram showing a laser processing apparatus according to a second embodiment of the present invention.

A second embodiment of the invention is shown in FIG. 4. In this embodiment, a laser-beam punching apparatus 31 includes a laser source 32, a converging lens 33, a reflecting mirror 34, a galvanomirror 35, a fixed table 36, sheet carrying rollers 37a, 37b, a laser-source driving circuit 40, a control circuit 41, and a galvanomirror driving circuit 42. The laser source 32, the converging lens 33, and the laser-source driving circuit 40 are similar to those in the first embodiment. The control circuit 41 includes a microcomputer in which a processing control program is stored.

The galvanomirror 35 can shift in directions A and B (direction B being perpendicular to direction A), both represented by arrows. A driving signal from the galvanomirror driving circuit 42 causes the galvanomirror 35 to change its reflection angle so as to scan the laser beam across the ceramic green sheet 45.

One surface of the ceramic green sheet 45 s supported by a resin carrier film 46. The ceramic green sheet 45 is formed by applying a slurry, obtained by mixing ceramic powder, a binder, etc., onto the top surface of the carrier film 46 at a predetermined thickness and removing excess material using a doctor blade or the like to form a belt-shaped ceramic green sheet. The belt-shaped ceramic green sheet 45 is carried by the sheet carrying rollers 37a and 37b, and is fed onto the fixed table 36. The carrier film 46 is removed from the ceramic green sheet in a subsequent laminating process for the ceramic green sheet 45.

A mask 50, similar to the mask 15 of the first embodiment, is mounted on the top surface of the ceramic green sheet 45. A matrix of laser-beam irradiation regions S, similar to the matrix of the first embodiment, are formed on the mask. Each laser-beam irradiation region S is provided with a plurality of circular through hole transmissive portions having diameters equal to the desired diameters of the through holes to be punched in the ceramic green sheet 45. The size of the mask 50 is preferably equal to the scanning region scanned by the galvanomirror 35.

In the laser-beam punching apparatus 31, a laser beam L emitted from the laser source 32 is converged by the converging lens 33 and is guided to the galvanomirror 35 by the reflection mirror 34. The Laser beam L reflected by the galvanomirror 35 causes the mask 50 to be irradiated with a beam spot Lb having an irradiation portion approximately equal to an irradiation region S on the mask 50. Since the ceramic green sheet 45 is highly absorptive of the laser wavelength band, the laser beams which pass through the transmissive portions in the mask 50 to melt the portions of the ceramic green sheet 45 on which they impinge and vaporize those portions to form the desired through holes.

A method for processing the ceramic green sheet 45 with the laser-beam punching apparatus 31 is described below.

The belt-shaped carrier film is rotated past the sheet carrying rollers 37a and 37b to move the ceramic green sheet 45 to an irradiation position located between the mask 50 and the table 36. The mask 50 is mounted on the top surface of the ceramic green sheet 45 using a vacuum chuck or the like.

Sides or corners of the mask 50 are detected, and the galvanomirror driving circuit moves the galvanomirror 35 to an initial setting corresponding to the start position of the scanning operation. Thereafter, the reflection angle of the galvanomirror 35 is varied at constant rate so that the position at which the laser beam L reflected by the galvanomirror 35 is incident on the mask 50 can be changed in a predetermined direction. When the amount of displacement of the galvanomirror 35 reaches the first hole-forming position, a single shot of the pulsed laser beam L is emitted and falls on the surface of the mask 50.

The laser beam L passes through the transmissive portions of one of the irradiation regions S formed in the mask 50 and forms a plurality of through holes in the ceramic green sheet 45. Since the mask 50 and the ceramic green sheet 45 are in contact with each other (or at least substantially adjacent one another), each such through hole has a shape approximately identical to the shape and size of a corresponding one of the transmissive portions of the mask 50. In this manner, a plurality of through holes (which are preferably round) can be simultaneously formed without using expensive equipment such as a precision lens. Subsequently, by intermittently emitting a single shot of the laser beam L each time the galvanomirror is displaced a certain amount (corresponding to movement from one irradiation portion S to the next), a desired number of through holes can be punched in the ceramic green sheet 45.

Since the pulse duration of the laser beam L is preferably in the order of microseconds or milliseconds, the formation of each through hole formed as a result of a single shot of the laser is done substantially instantaneously. As a result, it is not always necessary to stop the galvanomirror 35, but it is possible to successively form groups of through holes while continuously changing the reflection angle of the galvanomirror 35.

After forming a predetermined number of through holes in the ceramic green sheet 45, the mask 50 is separated from the ceramic green sheet 45 using a vacuum chuck or the like. Next, the sheet carrying rollers 37a and 37a are rotated to move the ceramic green sheet 45 a predetermined distance in the arrow direction C (shown in FIG. 4) until the next portion of the ceramic green sheet 45 in which through holes are to be formed is fed onto the fixed table 36. In this manner, the successive formation of through holes can be performed without changing the roll shape of the ceramic green sheet 45. The foregoing process relies on both the motion of the green ceramic sheet (as it is moved by the belt 46) and the movement of galvanomirror 35 to ensure the creation of a plurality of through holes in the green ceramic sheet while limiting the necessary angles of incidence or the galvanomirror 35 and ensuring that the belt 46 is moved only intermittently.

Third Embodiment

Figure 5:
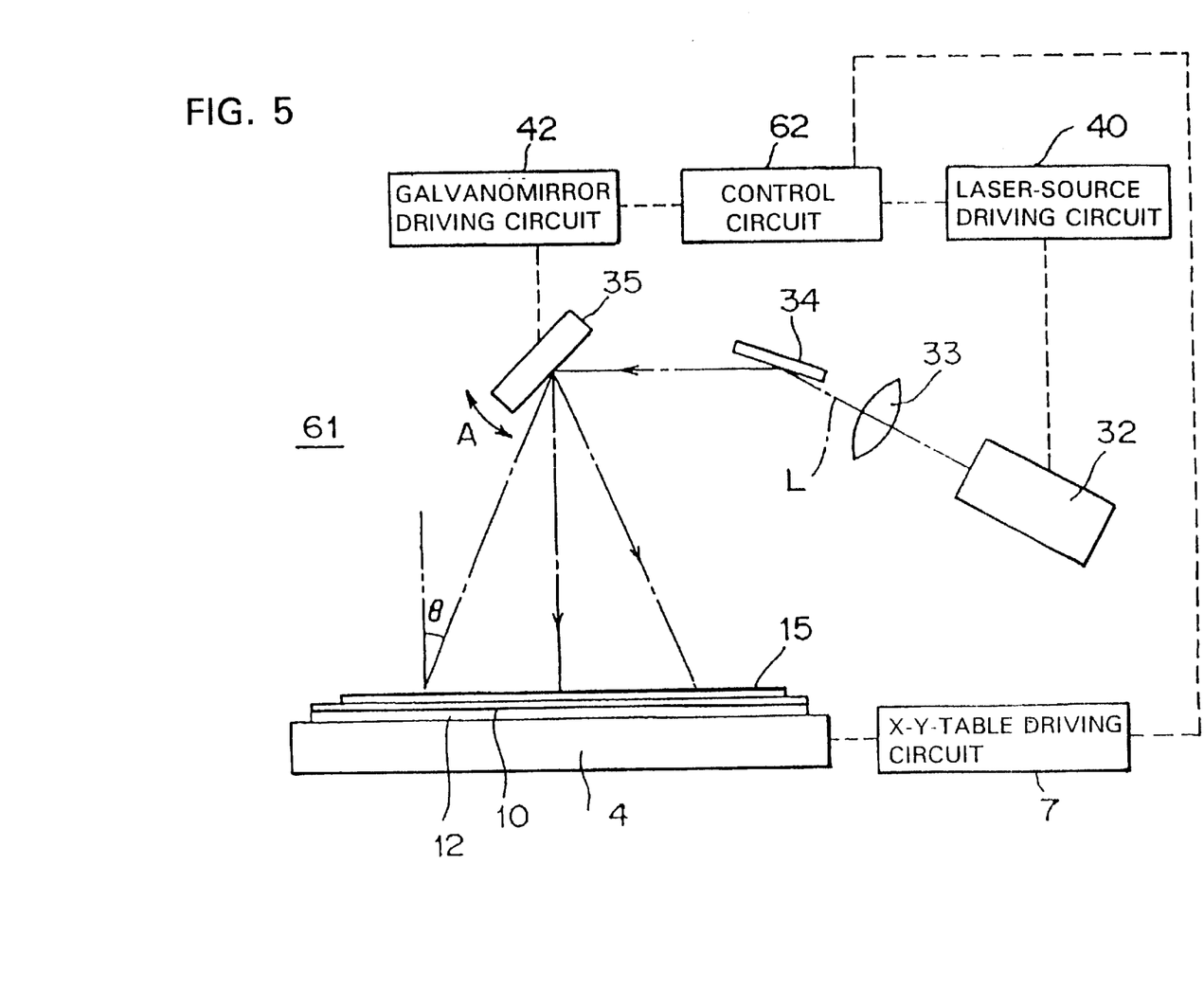
FIG. 5 is a block diagram showing a laser processing apparatus according to a third embodiment of the present invention.

A laser-beam punching apparatus according to a third embodiment of the present invention is shown in FIG. 5. In this embodiment, a combination of the X-Y table 4 described in the first embodiment and the galvanomirror 35 described in the second embodiment is employed. As shown in FIG. 5, a laser-beam punching apparatus 61 includes a laser source 32, a converging lens 33, a reflection mirror 34, a galvanomirror 35, an X-Y table 4, a laser-source driving circuit 40, a control circuit 62, a galvanometer-mirror driving circuit 42 and an X-Y.-table driving circuit 7.

The control circuit 62 includes a microcomputer in which a control program is stored. The control circuit 62 controls the laser source 32 by means of the laser-source driving circuit 40, the X-Y table 4 by means of the X-Y-table driving circuit 7, and the galvanomirror 35 by means of the galvanomirror driving circuit 42. The laser source 32, the X-Y table 4 and the galvanomirror 35 are driven by the control circuit 62 in synchronization.

A method for processing a ceramic green sheet 10 by using the laser-beam punching apparatus 61 is described as follows:

The ceramic green sheet 10, supported by a carrier film 12, is mounted on the X-Y table 4 using a vacuum chuck or the like so that the top surface of the ceramic green sheet 10 is directed upward. The X and Y axes of the X-Y table 4 and two sides of the ceramic green sheet 10 are disposed substantially in parallel to one another. Similarly, the mask 15 is mounted on the ceramic green sheet 10 so that the X and Y axes of the X-Y table 4 and two sides of the mask 15 are substantially parallel.

The X-Y table 4 is then moved to an initial operating position. This is done by detecting the sides or corners of the mask 15 and moving the X-Y table 4 to a position wherein a predetermined part of the mask 15 is positioned at a scanning region to be scanned by using the galvanomirror 35. Subsequently, sides or corners of the mask 15 are detected and the reflection angle of the galvanomirror 35 is moved to its initial position.

After performing the initial setting operations, the control circuit 62 synchronizes movement of both the galvanomirror 35 and the X-Y table 4 to achieved the desired scan of the mask 15. The reflection angle of the galvanomirror 35 is preferably displaced at constant velocity so that a position on which the laser beam L reflected by the galvanomirror 35 is incident can be changed in a predetermined direction and the X-Y table 4 is moved at constant velocity so that the mask 15 is moved in a predetermined direction. When the displacement of the galvanomirror 35 and the motion amount of the X-Y table 4 causes the two elements to reach a first hole-formation position, a single shot of the pulsed laser beam L is emitted to the mask 15.

Subportions of the single shot of the laser beam L will pass through the transmissive portion of one of the irradiation regions S formed on the mask 15 and will form a plurality of through holes in the ceramic green sheet 10. Since the mask 15 and the ceramic green sheet 10 are in contact (or at least substantially adjacent one another), the shape of the so formed through holes will be approximately identical to the shape and size of the corresponding transmissive portions of the mask 15. In this manner, a plurality of through holes having high degree of roundness (or any other desired shape) can be formed simultaneously.

By synchronizing the movement of the galvanomirror 35 and the X-Y table 4, and emitting the laser beam L, the speed of the through hole formation process can be increased.

Other Embodiments

The through hole forming process and apparatus of the present invention is not limited to the foregoing embodiments. A large number of variations of these embodiments can be made within the scope of the invention disclosed.

Figure 6:
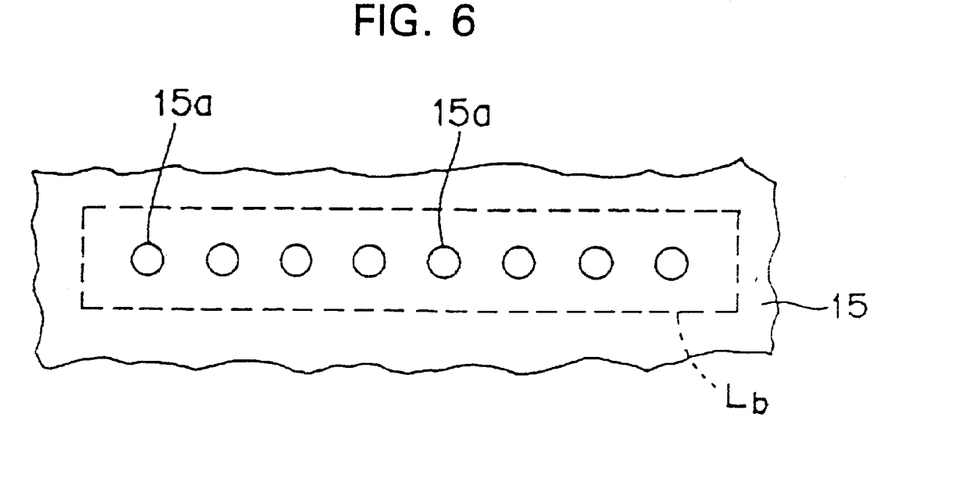
FIG. 6 is a plan view showing a modification of beam spots formed by a laser beam.
Figure 7:
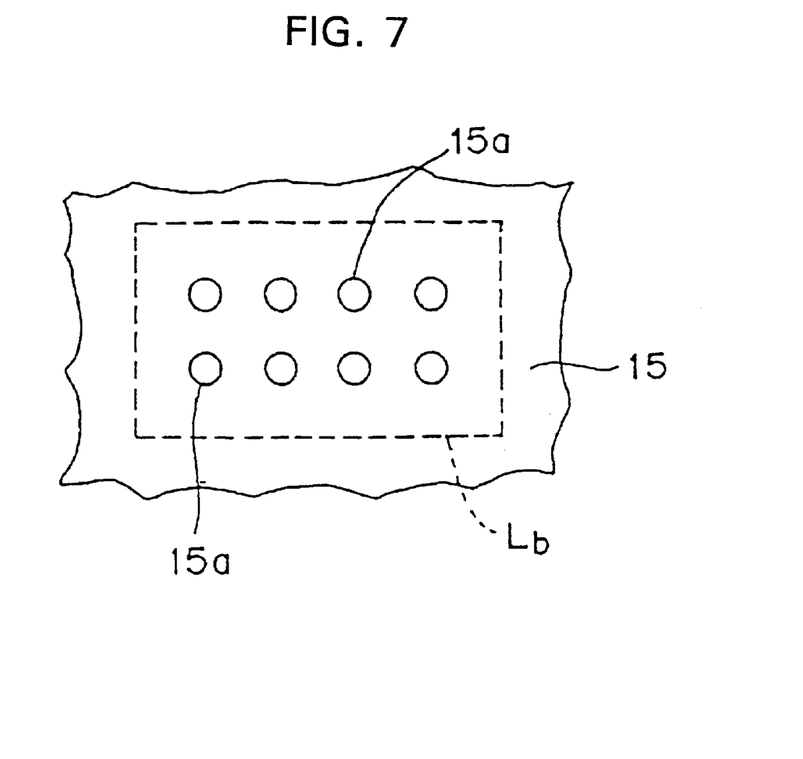
FIG. 7 is a plan view showing another modification of beam spots formed by a laser beam.

By way of example, the spot shape of the laser beam may be any desired shapes as long as the energy density of the spot shape is capable of forming through holes and positioning openings. For example, in order to punch one or two rows of a plurality of through holes in a ceramic green sheet, as shown in FIGS. 6 and 7, respectively, a laser beam spot Lb having a rectangular shape may be used. Such a laser beam shape can be formed by passing a laser beam through an aperture having a rectangular slit. By using a laser beam having a rectangular spot shape, irradiation portions do not overlap when the laser beam is successively emitted to the ceramic green sheet. As a result, through holes can be formed more efficiently than in the case of a conventional circular beam spot where adjacent arc-shaped irradiation portions overlap.

The number and shape of through hole transmissive portions and transmissive alignment marks may also be changed as desired. For example, in addition to a circle and a cross, a rectangle, a triangle, an ellipse, another shape, and so forth may be used. The mask 15 described in the above embodiment includes a plurality of irradiation portions S. However, other masks may be used. For example, a mask may include a single irradiation portion S. In this case, the mask will not normally be mounted on the ceramic green sheet (or carrier film) in advance, and whenever the mask reaches each opening-formation position by moving the ceramic green sheet, after once terminating the movement of the ceramic green sheet, the operation of mounting the mask on the ceramic green sheet (or carrier film) and dismounting the mask after forming the openings is repeated. Another possibility is to form a gap between the fixed table and the mask and moving the ceramic green sheet through the gap.

In addition, the single laser beam emitted from the laser source may be separated into a plurality of laser beams, and each laser beam may be passed through a respective transmissive portion of a mask. This alternative increases the punching speed.

The present invention may be embodied in other specific forms without departing from the spirit or essential attributes thereof and, accordingly, reference should be made to the appended claims, rather than to the foregoing specification, as indicating the scope of the invention.

What is claimed is:

1. A method for forming through holes in a ceramic green sheet, said method comprising the steps of:
    mounting a mask on a surface of a ceramic green sheet, said mask having a plurality of irradiation regions, each of said irradiating regions including a plurality of through hole transmissive portions;
    irradiating each of said irradiation regions with a single shot of a pulsed laser beam having a predetermined incidence angle, so that through holes are formed in said ceramic green sheet by portions of said laser beam which pass through said through hole transmissive portions; and
    wherein said mask is irradiated with said pulsed laser beam while said ceramic green sheet is moving.

2. A method for forming through holes in a ceramic green sheet according to claim 1, wherein said ceramic green sheet is moved at a constant rate and in a single direction while said mask is irradiated with said laser beam.

3. A method for forming through holes in a ceramic green sheet according to claim 1, wherein at least two of said through hole transmissive portions have different shapes and therefore result in the formation of respective through holes of different shape.

4. A method for forming through holes in a ceramic green sheet according to claim 1, wherein the shape of said laser beam is round in cross section.

5. A method for forming through holes in a ceramic green sheet according to claim 1, wherein the shape of said laser beam is rectangular in cross section.

6. A method for forming through holes in a ceramic green sheet according to claim 1, wherein:
    said mask has a plurality of irradiation regions each of which includes a plurality of said through hole transmissive portions; and
    said irradiating step comprises the steps of sequentially irradiating each of said irradiation regions with a plurality of pulsed laser beams, each pulsed laser beam having a cross sectional area sufficiently large to encompass all of said through hole transmissive portions located any single irradiation region.

7. A method for forming through holes in a ceramic green sheet according to claim 1, wherein said step of mounting said mask on said surface of a ceramic green sheet comprises the step of causing relative movement between said ceramic green sheet and said mask until said mask is in contact with a surface of said ceramic green sheet.

8. A method for forming through holes in a ceramic green sheet according to claim 1, wherein said step of mounting said mask on said surface of a ceramic green sheet comprises the step of causing relative movement between said ceramic green sheet and said mask until said mask is substantially adjacent a surface of said ceramic green sheet.

9. A method for forming through holes in a ceramic green sheet according to claim 1, wherein said mask is further provided with at least one transmissive alignment portion and wherein said pulsed laser beam is applied to said at least one transmissive alignment portion so as to form at least one positioning hole in said ceramic green sheet.

10. A method for forming through holes in a ceramic green sheet according to claim 9, wherein irradiated portions by said laser beam are melted and vaporized, whereby said through holes and said positioning hole are formed with said single shot of said laser beam.

11. A method for forming through holes in a ceramic green sheet according to claim 1, wherein a surface of said mask upon which said pulsed laser beam is incident is composed of a material having high reflectance to said pulsed laser beam.

12. A method for forming through holes in a ceramic green sheet according to claim 1, wherein said pulsed laser beam is a pulsed $CO_2$ laser beam.

13. A method for forming through holes in a ceramic green sheet according to claim 1, wherein said ceramic green sheet is coupled to one surface of a resin carrier film.

14. A method for forming through holes in a ceramic green sheet according to claim 1, wherein said irradiating step comprises the step of repetitively applying said pulsed laser beam to different portions of said mask, said pulsed laser beam being directed towards said mask by a galvanomirror whose reflection angle changes to move said laser beam from one portion of said mask to another.

15. A method for forming through holes in a ceramic green sheet according to claim 14, wherein said mask is further provided with transmissive alignment portions and wherein said pulsed laser beam is applied to said transmissive alignment portions so as to form positioning holes in said ceramic green sheet.

16. A method for forming through holes in a ceramic green sheet according to claim 1, wherein said predetermined incident angle of said laser beam with respect to the normal to said mask is set to a maximum of 20 degrees.

17. A method for forming through holes in a ceramic green sheet according to claim 1, wherein each of said plurality of irradiation regions has a predetermined configuration of said plurality of through hole transmissive portions.

* * * * *